(12) United States Patent
Namiki et al.

(10) Patent No.: US 10,873,016 B2
(45) Date of Patent: Dec. 22, 2020

(54) LIGHT-EMITTING DEVICE AND METHOD FOR MANUFACTURING THE SAME

(71) Applicant: DEXERIALS CORPORATION, Tokyo (JP)

(72) Inventors: Hidetsugu Namiki, Tochigi (JP); Keiji Honjo, Tochigi (JP); Yasuyuki Higuchi, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 16/306,508

(22) PCT Filed: May 2, 2017

(86) PCT No.: PCT/JP2017/017275
§ 371 (c)(1),
(2) Date: Nov. 30, 2018

(87) PCT Pub. No.: WO2017/208726
PCT Pub. Date: Dec. 7, 2017

(65) Prior Publication Data
US 2019/0157537 A1   May 23, 2019

(30) Foreign Application Priority Data
May 31, 2016 (JP) .................................. 2016-108262

(51) Int. Cl.
*H01L 33/36* (2010.01)
*H01L 33/62* (2010.01)
(Continued)

(52) U.S. Cl.
CPC .......... *H01L 33/62* (2013.01); *H01L 25/0753* (2013.01); *H01L 33/54* (2013.01);
(Continued)

(58) Field of Classification Search
None
See application file for complete search history.

(56) References Cited

U.S. PATENT DOCUMENTS 8,758,546 B2   6/2014   Ishigami et al.
9,236,551 B2   1/2016   Nishimura et al.
(Continued)

FOREIGN PATENT DOCUMENTS

CN   103855142 A   6/2014
CN   105009314 A   10/2015
(Continued)

OTHER PUBLICATIONS

Jun. 27, 2017 International Search Report issued in International Patent Application No. PCT/JP2017/017275.
(Continued)

*Primary Examiner* — Ali Naraghi
(74) *Attorney, Agent, or Firm* — Oliff PLC

(57) ABSTRACT

A light-emitting device and a method for manufacturing the same capable of suppressing connection defects of light-emitting elements and improving electrical connectivity. A substrate includes a first mounting region for mounting a first light-emitting element, a second mounting region for mounting a second light-emitting element, a first electrode connected to one electrode of the first light-emitting element and one electrode of the second light-emitting element, a second electrode formed in the first mounting region and connected to the other electrode of the first light-emitting element, and a third electrode formed in the second mounting region and connected to the other electrode of the second light-emitting element. In the first electrode, a groove is formed between the first mounting region and the second mounting region.

14 Claims, 4 Drawing Sheets

(51) Int. Cl.
 *H01L 25/075* (2006.01)
 *H01L 33/56* (2010.01)
 *H01L 33/54* (2010.01)

(52) U.S. Cl.
 CPC .... *H01L 33/56* (2013.01); *H01L 2224/16225* (2013.01); *H01L 2224/73204* (2013.01); *H01L 2224/83192* (2013.01); *H01L 2933/0066* (2013.01); *H01L 2933/0091* (2013.01)

(56) References Cited

U.S. PATENT DOCUMENTS

| | | | |
|---|---|---|---|
| 9,955,619 | B2 | 4/2018 | Oyu et al. |
| 2006/0043382 | A1 | 3/2006 | Matsui et al. |
| 2010/0277919 | A1* | 11/2010 | Okada ................. H01L 25/0753 362/249.02 |
| 2012/0113328 | A1* | 5/2012 | Takeshima ........ G02F 1/133603 348/739 |
| 2013/0092310 | A1 | 4/2013 | Ishigami et al. |
| 2014/0153238 | A1 | 6/2014 | Nishimura et al. |
| 2014/0239331 | A1 | 8/2014 | Oyu et al. |
| 2015/0380607 | A1* | 12/2015 | Wu ......................... H01L 33/08 257/89 |
| 2016/0126225 | A1* | 5/2016 | Huang ................ H01L 25/0753 257/91 |

FOREIGN PATENT DOCUMENTS

| | | |
|---|---|---|
| JP | H04-225327 A | 8/1992 |
| JP | H05-152464 A | 6/1993 |
| JP | H11-340281 A | 12/1999 |
| JP | 2003-026763 A | 1/2003 |
| JP | 2004-055848 A | 2/2004 |
| JP | 2005-120357 A | 5/2005 |
| JP | 2006-517738 A | 7/2006 |
| JP | 2011-029634 A | 2/2011 |
| JP | 2011-057917 A | 3/2011 |
| JP | 2013-012529 A | 1/2013 |
| JP | 2014-132629 A | 7/2014 |
| KR | 10-2013-0120457 A | 11/2013 |
| WO | 2012/046539 A1 | 4/2012 |
| WO | 2014/132979 A1 | 9/2014 |

OTHER PUBLICATIONS

Dec. 26, 2019 Office Action issued in Korean Patent Application No. 10-2018-7033258.
Apr. 7, 2020 Office Action issued in Japanese Patent Appliclation No. 2016-108262.
Jun. 5, 2020 Office Action issued in Taiwan Patent Application No. 10920536140.
Jul. 24, 2020 Office Action issued in Chinese Patent Application No. 201780030182.9.
Oct. 22, 2020 Office Action issued in Korean Patent Application No. 10-2020-7026060.

* cited by examiner

LIGHT-EMITTING DEVICE AND METHOD FOR MANUFACTURING THE SAME

TECHNICAL FIELD

The present disclosure relates to a light-emitting device and method for manufacturing the same in which a plurality of light-emitting elements, such as LEDs (Light Emitting Diode) are mounted. This application claims priority to Japanese Patent Application No. 2016-108262 filed on May 31, 2016 in Japan, the entire content of which is hereby incorporated by reference.

BACKGROUND ART

Due to wire bonding used in conventional electrical bonding of light-emitting elements to substrates suffering from high connection defect rates, anisotropic conductive paste (ACP) in which conductive particles are dispersed in an adhesive agent has been proposed as an alternative (for example, see PLT 2 to 5). For example, PLT 5 describes using an anisotropic conductive adhesive agent containing light-reflective electrically insulating particles to improve light extraction efficiency.

CITATION LIST

Patent Literature

PLT 1: Japanese Unexamined Patent Application Publication No. H04-225327
PLT 2: Japanese Unexamined Patent Application Publication No. 2005-120357
PLT 3: Japanese Unexamined Patent Application Publication No. H05-152464
PLT 4: Japanese Unexamined Patent Application Publication No. 2003-026763
PLT 5: Japanese Unexamined Patent Application Publication No. 2011-057917

SUMMARY OF THE INVENTION

Technical Problem

However, in the case of sequentially mounting a first light-emitting element and a second light-emitting element in close proximity, anisotropic conductive paste used to mount the first light-emitting element can protrude into the mounting region of the second light-emitting element and cure, which has caused connection defects in the second light-emitting element.

FIG. 6 is a cross-sectional view schematically illustrating a manufacturing method of a conventional light-emitting element. As illustrate in FIG. 6 (A), a substrate has a first mounting region 231 for mounting a first light-emitting element 211 and a second mounting region 232 for mounting a second light-emitting element 212. Furthermore, the substrate has a first electrode 221 for connecting to one electrode of the first light-emitting element 211 and one electrode of the second light-emitting element 212, a second electrode 222 for connecting to the other electrode of the first light-emitting element 211 formed on the first mounting region 231, and a third electrode 223 for connecting to the other electrode of the second light-emitting element 212 formed on the second mounting region 232.

As illustrated in FIGS. 6 (B) and (C), when applying the first anisotropic conductive paste 241 onto the first mounting region 231 and mounting the first light-emitting element 211, the first anisotropic conductive paste 241 protrudes into the second mounting region 232 and cures. Consequently, as illustrated in FIGS. 6 (D) and (E), when applying the second anisotropic conductive paste 242 onto the second mounting region 232 and mounting the second light-emitting element 212, the second light-emitting element 212 is mounted above cured material from the protruding first anisotropic conductive paste 241, resulting in a connection defect.

In view of such conventional circumstances, an object of the present disclosure is to provide a light-emitting device and a method for manufacturing the same capable of suppressing connection defects of light-emitting elements and achieving excellent electrical connectivity.

Solution to Problem

In view of the problems described above, a light-emitting device according to the present disclosure includes a first light-emitting element and a second light-emitting element each having a pair of electrodes on one surface, a substrate having a first mounting region on which the first light-emitting element is mounted, a second mounting region on which the second light-emitting element is mounted, a first electrode having a groove formed between the first mounting region and the second mounting region and connected to one electrode of the first light-emitting element and one electrode of the second light-emitting element, a second electrode formed in the first mounting region and connected to the other electrode of the first light-emitting element, and a third electrode formed in the second mounting region and connected to the other electrode of the second light-emitting element, a first anisotropic conductive film connecting the first light-emitting element to the first electrode and the second electrode, and a second anisotropic conductive film connecting the second light-emitting element to the first electrode and the third electrode.

Furthermore, a method for manufacturing a light-emitting device according to the present disclosure includes a preparing step of preparing a first light-emitting element and a second light-emitting element each having a pair of electrodes on one surface, and a substrate having a first mounting region on which the first light-emitting element is to be mounted, a second mounting region on which the second light-emitting element is to be mounted, a first electrode having a groove formed between the first mounting region and the second mounting region, the first electrode to be connected to one electrode of the first light-emitting element and to one electrode of the second light-emitting element, a second electrode formed in the first mounting region, the second electrode to be connected to the other electrode of the first light-emitting element, and a third electrode formed in the second mounting region, the third electrode to be connected to the other electrode of the second light-emitting element, a first mounting step of mounting the first light-emitting element onto the first mounting region using a first anisotropic conductive paste, and a second mounting step of mounting the second light-emitting element onto the second mounting region using a second anisotropic conductive paste.

Advantageous Effects of Invention

According to the present disclosure, forming a groove in an electrode between a first mounting region for mounting a first light-emitting element and a second mounting region for mounting a second light-emitting element can suppress connection defects of light-emitting elements and improve electrical connectivity.

DESCRIPTION OF EMBODIMENTS

Embodiments of the present invention will now be described in detail according to the following order with reference to the accompanying drawings.
1. Light-Emitting Device
2. Light-Emitting Device Manufacturing Method
3. Examples 1. Light-Emitting Device A light-emitting device according to an embodiment of the present disclosure includes a first light-emitting element and a second light-emitting element each having a pair of electrodes on a surface on one side; a substrate having a first mounting region on which the first light-emitting element is mounted, a second mounting region on which the second light-emitting element is mounted, a first electrode having a groove formed between the first mounting region and the second mounting region and connected to one electrode of the first light-emitting element and one electrode of the second light-emitting element, a second electrode formed in the first mounting region and connected to the other electrode of the first light-emitting element, and a third electrode formed in the second mounting region and connected to the other electrode of the second light-emitting element; a first anisotropic conductive film connecting the first light-emitting element to the first electrode and the second electrode; and a second anisotropic conductive film connecting the second light-emitting element to the first electrode and the third electrode.

Figure 1:
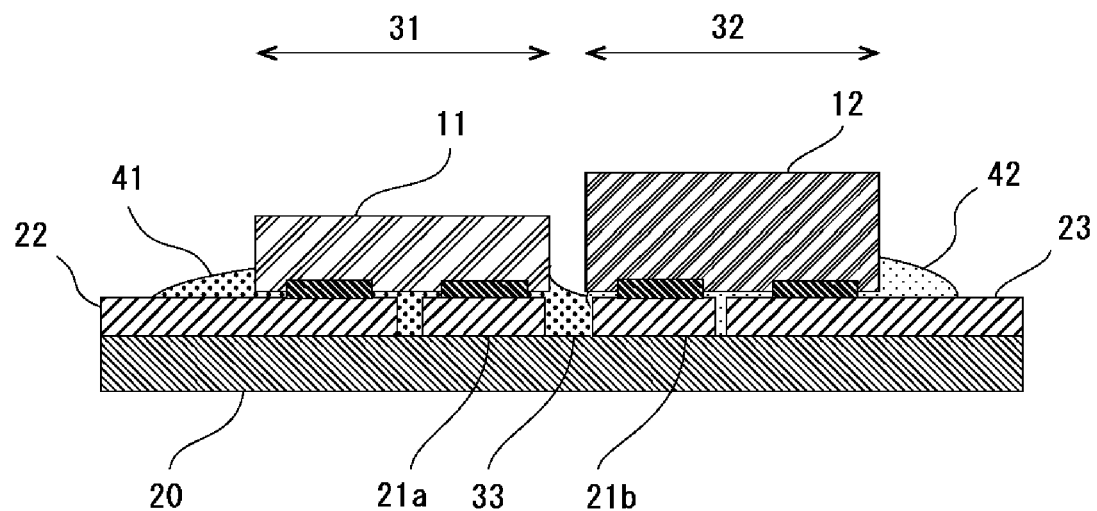
FIG. 1 is a cross-sectional view schematically illustrating one example of a light-emitting device according to an embodiment.
Figure 2:
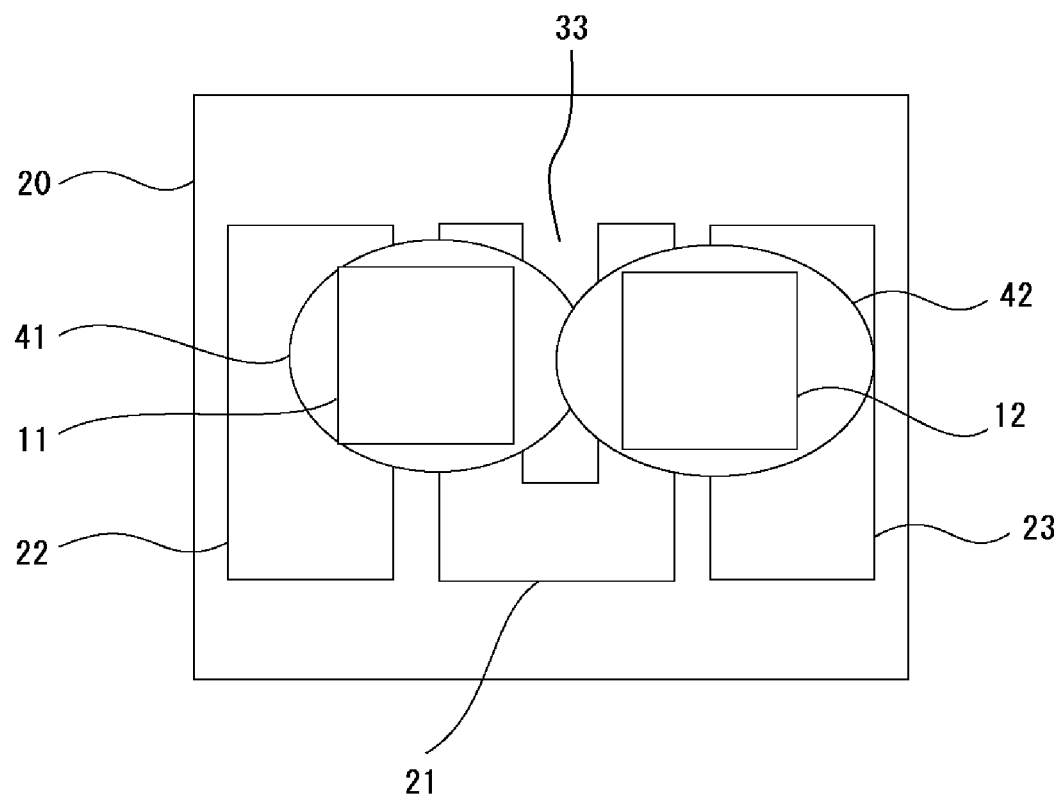
FIG. 2 is a top view schematically illustrating one example of a light-emitting device according to an embodiment.

FIG. 1 is a cross-sectional view schematically illustrating one example of a light-emitting device according to an embodiment and FIG. 2 is a top view schematically illustrating one example of a light-emitting device according to an embodiment.

A first light-emitting element 11 and a second light-emitting element 12 each have a pair of electrodes on one surface and are so-called flip-chip LEDs (Light Emitting Diode) chips in a lateral configuration respectively having, for example, a p-side first conductive electrode and an n-side second conductive electrode on the same side. The first light-emitting element 11 and the second light-emitting element 12 may have either the same size or different sizes and, for example, may be different types such as blue light-emitting elements or red light emitting elements. Mounting different types of light-emitting elements, such as a blue light-emitting element and a red light-emitting element, in close proximity allows colors obtained by mixing colors to be produced.

Figure 3:
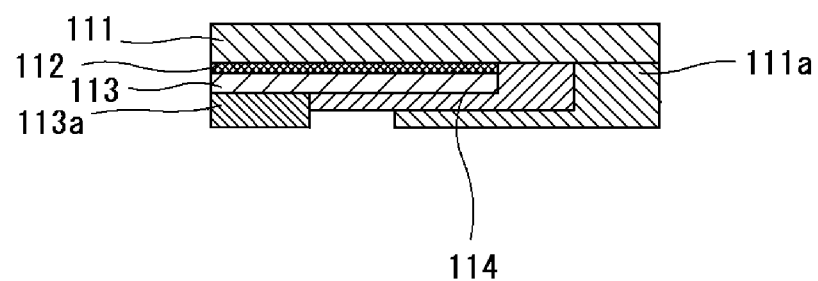
FIG. 3 is a cross-sectional view schematically illustrating an example structure of a blue light-emitting element.

FIG. 3 is a cross-sectional view schematically illustrating an example structure of a blue light-emitting element. The blue light-emitting element has a first conductive cladding layer 111 made of, for example, n-GaN, an active layer 112 made of, for example, $In_xAl_yGa_{1-x-y}N$, and a second conductive cladding layer 113 made of, for example, p-GaN, in what is known as a double heterostructure. Furthermore, the blue light-emitting element has a first conductive electrode 111a in a portion of the first conductive cladding layer 111 and a second conductive electrode 113a in a portion of the second conductive cladding layer 113 formed by a passivation layer 114. Voltage applied across the first conductive electrode 111a and the second conductive electrode 113 concentrates carriers in the active layer 112 which recombine to generate light.

Figure 4:
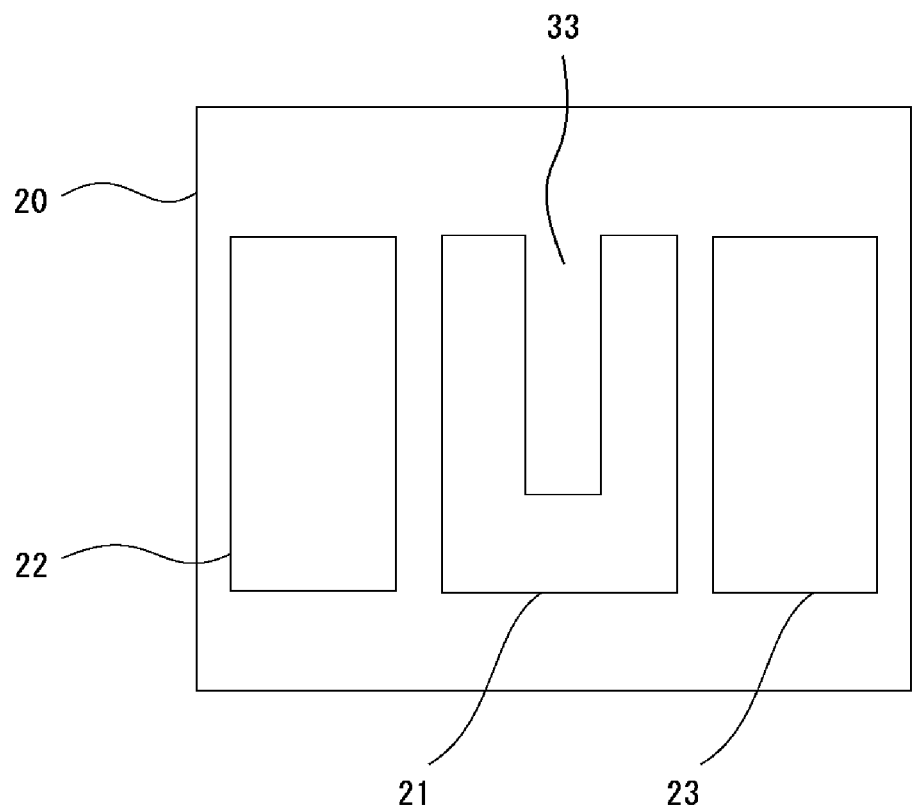
FIG. 4 is a top view schematically illustrating one example of a substrate.
Figure 5A:
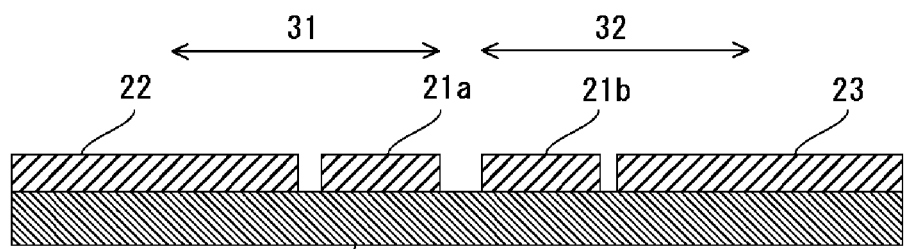
FIG. 5 schematically illustrates a method for manufacturing a light-emitting device according to an embodiment in (A) a cross-sectional view illustrating a preparing step of preparing a substrate, (B) a cross-sectional view illustrating a first applying step of applying a first anisotropic conductive paste, (C) a cross-sectional view illustrating a first connecting step of connecting a first light-emitting element, (D) a cross-sectional view illustrating a second applying step of applying a second anisotropic conductive paste, and (E) a cross-sectional view illustrating a second connecting step of connecting a second anisotropic conductive paste.
Figure 5B:
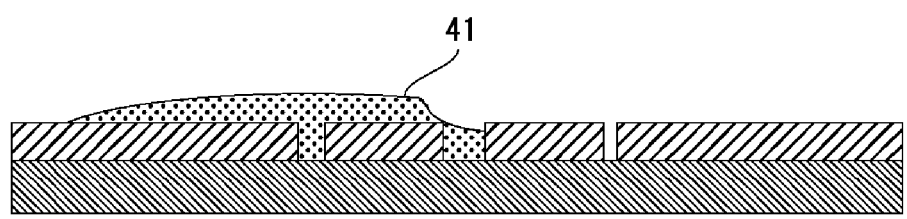
Figure 5C:
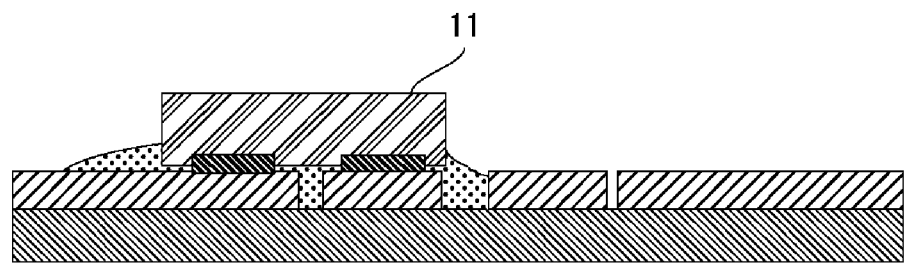
Figure 5D:
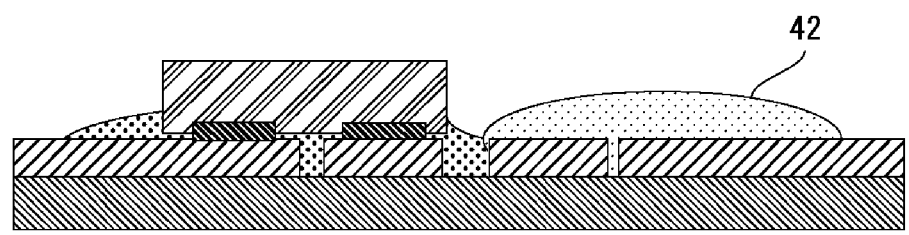
Figure 5E:
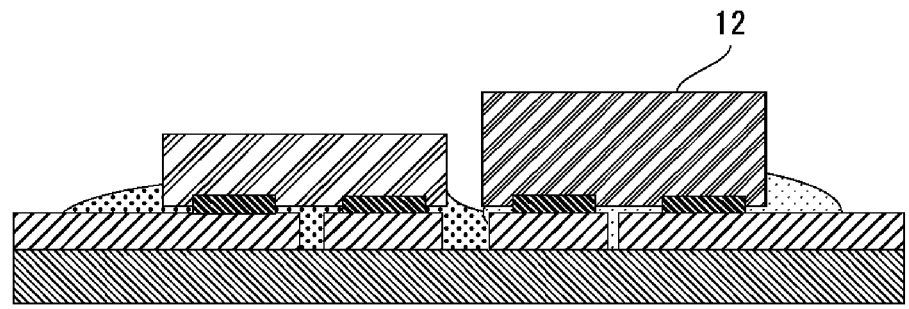
Figure 6A:
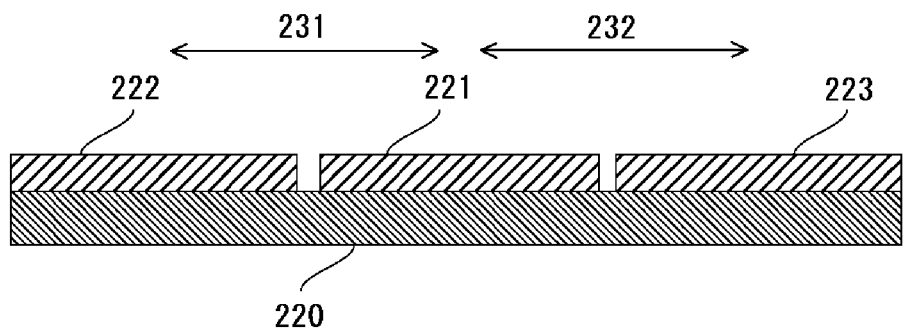
FIG. 6 schematically illustrates a conventional method for manufacturing a light-emitting device in (A) a cross-sectional view illustrating a preparing step of preparing a substrate, (B) a cross-sectional view illustrating a first applying step of applying a first anisotropic conductive paste, (C) a cross-sectional view illustrating a first connecting step of connecting a first light-emitting element, (D) a cross-sectional view illustrating a second applying step of applying a second anisotropic conductive paste, and (E) a cross-sectional view illustrating a second connecting step of connecting a second anisotropic conductive paste.
Figure 6B:
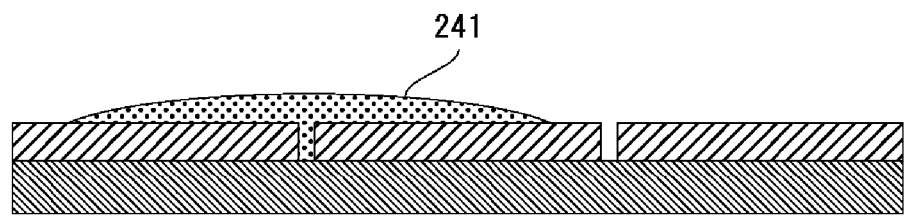
Figure 6C:
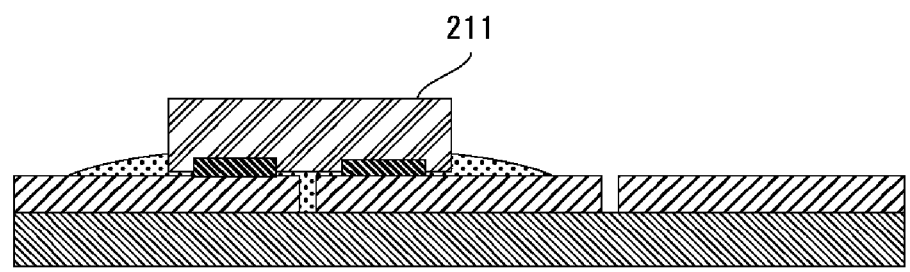
Figure 6D:
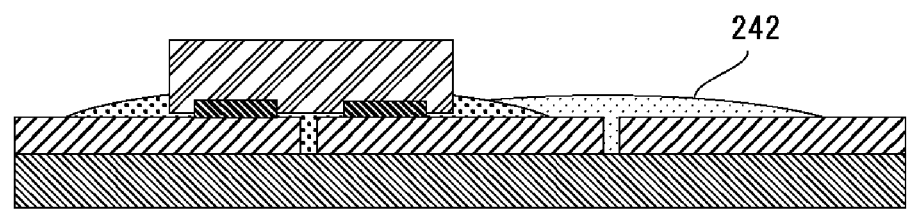
Figure 6E:
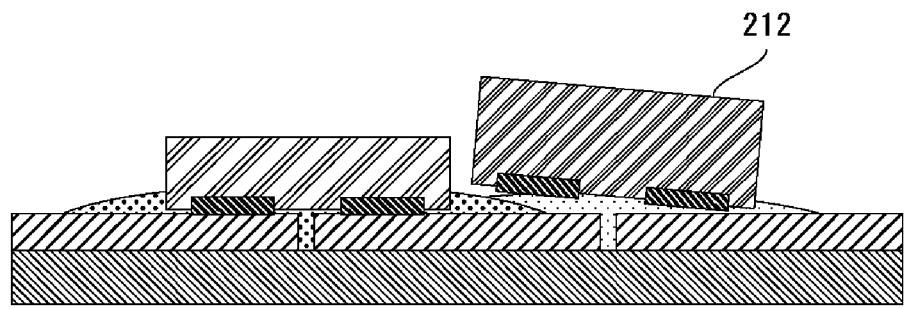

FIG. 4 is a top view schematically illustrating one example of a substrate. As illustrated in FIGS. 1 and 4, the substrate has a first mounting region 31 for mounting the first light-emitting element 11 and a second mounting region 32 for mounting the second light-emitting element 12. Furthermore, the substrate has a first electrode 21 for connecting to one electrode of the first light-emitting element 11 and one electrode of the second light-emitting element 12, a second electrode 22 formed on the first mounting region 31 for connecting to the other electrode of the first light-emitting element 11, and a third electrode 23 formed on the second mounting region 32 for connecting to the other electrode of the second light-emitting element 12.

The first electrode 21, the second electrode 22, and the third electrode 23 are conductive patterns formed on a substrate material 20 and are connected to the first light-emitting element 11 and second light-emitting element 12. The substrate material 20 is preferably made of a material having high heat-tolerance such as ceramic or glass. Moreover, as the conductive patterns, a patterned conductive foil such as Cu foil is preferably used. As a method for forming the conductive patterns, for example, a conductive pattern can be obtained by forming a mask on a conductive layer and etching to remove non-masked regions of the conductive layer.

As illustrated in FIGS. 1 and 4, in the first electrode 21, a groove 33 is formed between the first mounting region 31 and second mounting region 32. Depth of the groove 33 can be selected according to the amount of the first anisotropic conductive paste 51 protruding from the first mounting region 31 when applying the first anisotropic conductive paste 51 or when compression bonding the first light-emitting element 11. In particular, the groove 33 preferably has a width of 10 to 100 µm and more preferably 20 to 80 µm. Furthermore, the groove 33 preferably has a depth of 1 to 30 µm and more preferably 5 to 20 µm.

Moreover, in the case of the first mounting region 31 and the second mounting region 32 being rectangular regions, the groove 33 formed in the first electrode 21 is preferably longer than a side of the first mounting region 31 adjacent to the second mounting region 32. Thereby, when applying the first anisotropic conductive paste or compression bonding the first light-emitting element 11, anisotropic conductive paste collects in the groove 33 so that the anisotropic can be prevented from protruding into the second mounting region 32.

It should be noted that groove 33 of the first electrode 21 is not limited to the configuration illustrated in FIGS. 1 and 4; for example, a conductive layer may be provided at the bottom of the groove. Thereby, in addition to improving electrical connectivity between the first light-emitting element 11 and the second light-emitting element 12, reflection from the surface of the conductive layer can improve light-extraction efficiency.

A first anisotropic conductive film 41 connects the first light-emitting element 11 to the first electrode 21 and the second electrode 22, and a second anisotropic conductive film 42 connects the second light-emitting element 12 to the first electrode 21 and the third electrode 23. The first anisotropic conductive film 41 and the second anisotropic conductive film 42 are cured products of an anisotropic conductive paste to be described below and create anisotropic conductive connections between the light-emitting elements and the substrate by trapping conductive particles between terminals (electrodes 111a and 213a) of the light-emitting elements and terminals (first electrode 21, second electrode 22, and third electrode 23) of the substrate.

Moreover, the first anisotropic conductive film 41 preferably contains light-reflective electrically insulating particles and is preferably filled in at least a portion of the groove 33 formed in the first electrode 21. Because the light-reflective electrically insulating particles filled in the groove 33 reflect light, this can improve light-extraction efficiency.

According to the light-emitting device of the present embodiment, forming the groove 33 in the first electrode 21 between the first mounting region 31 and the second mounting region 32 can suppress connection defects in the second light-emitting element 12 and improve electrical connectivity. Furthermore, filling the first anisotropic conductive film 41 containing reflective electrically insulating particles in at least a portion of the groove 33 formed in the first electrode 21 can improve light-extraction efficiency.

2. Method for Manufacturing Light-Emitting Device

A method for manufacturing a light-emitting device according to embodiments of the present disclosure includes a preparing step of preparing a first light-emitting element and a second light-emitting element each having a pair of electrodes on one surface, and a substrate having a first mounting region on which the first light-emitting element is to be mounted, a second mounting region on which the second light-emitting element is to be mounted, a first electrode having a groove formed between the first mounting region and the second mounting region, the first electrode to be connected to one electrode of the first light-emitting element and to one electrode of the second light-emitting element, a second electrode formed in the first mounting region, the second electrode to be connected to the other electrode of the first light-emitting element, and a third electrode formed in the second mounting region, the third electrode to be connected to the other electrode of the second light-emitting element, a first mounting step of mounting the first light-emitting element onto the first mounting region using a first anisotropic conductive paste, and a second mounting step of mounting the second light-emitting element onto the second mounting region using a second anisotropic conductive paste.

FIG. 5 schematically illustrates a method for manufacturing a light-emitting device according to an embodiment in (A) a cross-sectional view illustrating a preparing step of preparing a substrate, (B) a cross-sectional view illustrating a first applying step of applying a first anisotropic conductive paste, (C) a cross-sectional view illustrating a first connecting step of connecting a first light-emitting element, (D) a cross-sectional view illustrating a second applying step of applying a second anisotropic conductive paste, and (E) a cross-sectional view illustrating a second connecting step of connecting a second anisotropic conductive paste. Hereinafter, a preparing step, a first applying step, a first connecting step, a second applying step, and a second connecting step will be explained.

Preparing Step

A preparing step includes preparing a first light-emitting element, a second light-emitting element, and a substrate. Because the first light-emitting element, the second light-emitting element, and the substrate are the same as in the first light-emitting element 11, second light-emitting element 12, and substrate in the light-emitting device described above, further description is omitted below.

As illustrated in FIG. 5 (A), a substrate has a first mounting region 31 for mounting a first light-emitting element 11 and a second mounting region 32 for mounting a second light-emitting element 12. Furthermore, the substrate has a first electrode 21 for connecting to one electrode of the first light-emitting element 11 and one electrode of the second light-emitting element 12, a second electrode 22 formed on the first mounting region 31 for connecting to the other electrode of the first light-emitting element 11, and a third electrode 23 formed on the second mounting region 32 for connecting to the other electrode of the second light-emitting element 12.

First Applying Step

As illustrated in FIG. 5 (B), the applying step includes applying a first anisotropic conductive paste 51 onto the first mounting region 31 of the substrate. The first anisotropic conductive paste 51, by being applied on the first mounting region 31, collects between the first electrode 21 and second electrode 22 as well as in the groove 33 in the first electrode 21. This prevents protrusion of the anisotropic conductive paste into the second mounting region 32.

The first anisotropic conductive paste 51 includes conductive particles dispersed in a binder (adhesive agent composition) and can be thermosetting ultraviolet curing, or combination thermosetting/ultraviolet curing, among other curing modes.

Examples of the conductive particles are metal particles and metal-coated resin particles; among these, fine particles of metal-coated resin are preferably used. The metal-coated resin particles are resin particles such as of epoxy resin, phenol resin, acrylic resin, acrylonitrile/styrene (AS) resin, benzoguanamine resin, divinylbenzene resin, or styrene resin coated on the surface with a metal such as Au, Ni, or Zn. The metal-coated resin particles are easily crushed and deformed when pressed and can thus increase contact surface area with wiring patterns and compensate for variations in wiring pattern height.

Average particle diameter of the conductive particles can be selected as appropriate according to electrode size of the light-emitting elements. In particular, the conductive particles preferably have an average particle diameter of 1 to 20 µm, more preferably 3 to 10 µm, and still more preferably 4 to 6 µm.

Furthermore, the anisotropic conductive paste preferably contains light-reflective electrically insulating particles. For example, the light-reflective electrically insulating particles can be at least one of the inorganic particles selected from the group consisting of titanium oxide ($TiO_2$), boron nitride (BN), zinc oxide (ZnO), and aluminum oxide ($Al_2O_3$). Among these, in view of high refractive indices, $TiO_2$ is preferably used.

Shape of the light-reflective electrically insulating particles may be sphere, flake, irregular, or needle shaped; however, in consideration of efficient reflection, spherical or flake shaped particles are preferable. Furthermore, in the case of being spherical, the light-reflective electrically insulating particles preferably have a size of 0.02 to 20 µm and more preferably 0.2 to 1 µm due to insufficient sizes reducing reflectance and excessive sizes tending to interfere with connections made with the conductive particles; in the case of being flake shaped, the light-reflective electrically insulating particles preferably have a length of 0.1 to 100 µm and more preferably 1 to 50 µm in a long dimension, a length of 0.01 to 10 µm and more preferably 0.1 to 5 µm in a short dimension, and a thickness of 0.01 to 10 µm and more preferably 0.1 to 5 µm.

The light-reflective electrically insulating particles made of inorganic particles preferably have a greater refractive index (JIS K7142) than the refractive index (JIS K7142) of the resin composition when cured, and more preferably greater than by at least approximately 0.02. This is because a low difference in refractive index reduces reflection efficiency at interfaces between these materials.

As the binder, an adhesive composition that is thermosetting, ultraviolet curing, or a combination thermosetting/ultraviolet curing, among other curing modes, can be used. Hereinafter, a thermosetting adhesive agent composition will be explained. Examples of thermosetting adhesive agent compositions include epoxy adhesive agents and acrylic adhesive agents; among these, an epoxy curing adhesive agent having a hydrogenated epoxy compound, an alicyclic epoxy compound, a heterocyclic epoxy compound, or similar compound as a primary constituent is preferably used. Among these primary constituents, hydrogenated epoxy compounds having excellent transparency and rapid curing properties such as bisphenol A epoxy resins are preferably used. An example of a commercially available hydrogenated bisphenol A epoxy resin is YX8000 of Mitsubishi Chemical Corporation.

Examples of thermosetting curing agents include aluminum chelate curing agents, acid anhydrides, imidazole compounds, and dicyan, among others. Among these, an aluminum chelate curing agent not prone to causing color changes in a cured product are preferable used. As an aluminum chelate curing agent, for example, Japanese Unexamined Patent Application Publication No. 2009-197206 describes holding an aluminum chelating agent and a silanol compound in a porous resin obtained by interfacial polymerization of a polyfunctional isocyanate compound and simultaneous radical polymerization of divinylbenzene.

First Connecting Step

As illustrated in FIG. 5 (C), the first connecting step includes connecting the first light-emitting element 11 to the substrate via the first anisotropic conductive paste 51. In the first connecting step, when pressing the first light-emitting element 11, because the anisotropic conductive paste collects in the groove 33, the anisotropic conductive paste can be prevented from protruding into the second mounting region 32.

Moreover, in the first connecting step, while pressing the first light emitting element 11, the first anisotropic conductive paste 51 is cured by heating or ultraviolet irradiation, selected as appropriate according to the first anisotropic conductive paste 51, to mount the first light emitting element 11 on the substrate. In particular, in the case of using a thermosetting anisotropic conductive paste, bonding conditions are preferably 150° C. for 5 min at 1 MPa to 260° C. for 10 seconds at 40 MPa.

Second Applying Step

As illustrated in FIG. 5 (D), the second applying step includes applying the second anisotropic conductive paste 52 onto the second mounting region 32 of the substrate. The second anisotropic conductive paste 52 is preferably the same as the first anisotropic conductive paste 51. This can reduce material costs.

Second Connecting Step

As illustrated in FIG. 5 (E), the second connecting step includes connecting the second light-emitting element 12 to the substrate via the second anisotropic conductive paste 52. As in the first connecting step, the second connecting step includes pressing the second light-emitting element 12 and curing the second anisotropic conductive paste 52 to mount the second light-emitting element 12 on the substrate. Bonding conditions in the second connecting step are preferably the same as those of the first connecting step. Thereby, the same bonding device and conditions can be used in the first connecting step and the second connecting step.

According to the method for manufacturing a light-emitting device of the present embodiment, because the groove 33 is formed in the first electrode 21 between the first mounting region 31 and second mounting region 32, in the first applying step, anisotropic conductive paste can be prevented from protruding into the second mounting region 32. Furthermore, in the first connecting step, when pressing the first light-emitting element 11, because anisotropic conductive paste collects in the groove 33, the anisotropic conductive paste can be prevented from protruding into the second mounting region 32. This can suppress connection defects of light-emitting elements and can achieve a light-emitting device having excellent electrically connectivity.

Furthermore, according to the method for manufacturing a light-emitting device of the present embodiment, because light-emitting elements are sequentially mounted on the substrate, light-emitting elements having different heights can be mounted in close proximity. Accordingly, the ability to mount different types of light-emitting elements, for example, blue and red light-emitting elements, in close proximity makes it possible to provide a light-emitting device that can produce colors using mixed light.

3. Examples

Examples according to the present disclosure will now be described. In these examples, light-emitting devices were prepared by using an anisotropic conductive paste to sequentially mount a first LED chip and then a second LED chip on a substrate before evaluating the light-emitting devices for electrical resistance. It should be noted that the present disclosure is not limited to these examples.

Electrical Resistance Evaluation

Initial electrical resistance of the second LED chip was measured in the light-emitting devices. Electrical resistance was evaluated by measuring Vf at If=20 mA; cases in which Vf rose by less than 5% were evaluated as "PASS," and cases in which Vf rose by 5% or more were evaluated as "FAIL."

Example 1

Substrates were prepared by forming a first electrode, a second electrode, and a third electrode on a ceramic substrate material; the electrodes were made of a Cu wiring plated with nickel at 5.0 µm and gold at 0.3 µm and had a width of 350 µm, a length of 500 µm, and an inter-electrode space of 50 µm. Furthermore, a groove was etched at a width of 50 µm, a length of 400 µm, and a depth of 15 µm into the first electrode for connecting to the first LED chip and the second LED chip.

As the first LED chip, red LEDs (If=2.9 V (If=20 mA), Au-plated electrodes) were prepared. As the second LED chip, blue LEDs (Vf=3.1 V (If=20 mA), Au-plated electrodes) were prepared.

As the anisotropic conductive paste, an aluminum chelate-curing epoxy resin blended with conductive particles (2 vol %) and titanium oxide (10 vol %) was prepared. In particular, 95 pts. mass of a hydrogenated bisphenol A epoxy resin (trade name YX8000 manufactured by Mitsubishi Chemical Corporation) was blended with 5 pts. mass of an aluminum chelate latent curing agent to prepare a binder. Into this binder, 2 vol % conductive particles (resin core, Au-plated) having an average particle diameter (D50) of 5.5 µm and 10 vol % titanium oxide particles having an average particle diameter (D50) of 0.25 µm were dispersed to prepare an anisotropic conductive paste.

The aluminum chelate latent curing agent was prepared as follows. First, 800 pts. mass of distilled water, 0.05 pts. mass of surfactant (NEWREX R-T available from NOF CORPORATION) and 4 pts. mass of polyvinyl alcohol (PVA 205 available from KURARAY CO., LTD.) as a dispersant were introduced into a 3-liter interfacial polymerization vessel equipped with a thermometer and evenly mixed. To this mixture were added 100 pts. mass of a 24% isopropanol solution of aluminum monoacetylacetonate bis-(ethylacetoacetate) (Aluminum Chelate D, Kawaken Fine Chemicals Co., Ltd.), 70 pts. mass of trimethylolpropane (1 mol) adduct (D109, Mitsui Takeda Chemicals, Inc.) of methylene diphenyl-4,4'-diisocyanate (3 mol), 30 pts. mass of divinylbenzene (Merck & Co., Inc.), and 0.30 pts. mass of a radical polymerization initiator (Peroyl L, NOF CORPORATION) dissolved in 100 pts. mass of ethyl acetate which was then emulsified and mixed with a homogenizer (10,000 rpm for 5 minutes) followed by interfacial polymerization at 80° C. for 6 hours. After completing the reaction, the polymerization reaction solution was allowed to cool to room temperature, and the interfacial polymerization particles were filtered and air dried. Thus, 100 pts. mass of a latent curing agent in the form of spherical particles having a diameter of approximately 2 µm was prepared by holding an aluminum chelating agent in a porous resin obtained by interfacial polymerization of a polyfunctional isocyanate compound and simultaneous radical polymerization of divinylbenzene.

After 10 pts. mass of this latent curing agent was added to a mixture of 40 pts. mass of a 24% isopropanol solution of aluminum monoacetylacetonate bis(ethylacetoacetate) (Aluminum Chelate D, Kawaken Fine Chemicals Co., Ltd.), 20 pts. mass of triphenylsilanol, and 40 pts. mass of ethanol, the mixture was stirred at 40° C. overnight, filtered, and dried to obtain an aluminum chelate latent curing agent impregnated with triphenylsilanol.

After positioning the substrate on a stage, the anisotropic conductive paste was applied onto a first LED chip mounting region of the substrate. The first LED chip was placed onto the anisotropic conductive paste and flip-chip mounted using a thermocompression tool under conditions of 200° C. for 60 seconds under a pressure of 1 kg/chip to mount the first LED chip. Next, the anisotropic conductive paste was applied onto a second LED chip mounting region of the substrate. The second LED chip was placed onto the anisotropic conductive paste and flip-chip mounted using the thermocompression tool under conditions of 200° C. for 60 seconds under a pressure of 1 kg/chip to mount the second LED chip. Thus, light-emitting devices having two mounted LED chips were prepared. As represented in Table 1, electrical resistance of the light-emitting devices of Example 1 was evaluated as PASS.

Comparative Example 1

Substrate were prepared by forming a first electrode, a second electrode, and third electrode on a ceramic substrate material; the electrodes were made of a Cu wiring plated with nickel at 5.0 µm and gold at 0.3 µm and had a width of 350 µm, a length of 500 µm, and an inter-electrode space of 50 µm; a groove was not formed in the first electrode. Other than the substrate, as in the Example 1, light-emitting devices having two mounted LED chips were prepared. As represented in Table 1, electrical resistance of the light-emitting devices of Comparative Example 1 was evaluated as FAIL.

TABLE 1

|  | Ex. 1 | Comp. 1 |
| --- | --- | --- |
| Groove | present | absent |
| Protrusion | absent | present |
| Connectivity Eval. | PASS | FAIL |

In Comparative Example 1, during mounting of the first LED chips, anisotropic conductive paste protruded into the second LED chip mounting regions and cured. Consequently, because the second LED chips were mounted on protruding anisotropic conductive films which had cured, connections were defective and the second LED chips failed to light.

In contrast, in Example 1, during mounting of the first LED chips, because excess anisotropic conductive paste collected in the etched groove and did not affect mounting of the second LED chips, excellent electrical connectivity was achieved.

REFERENCE SIGNS LIST 11 first light-emitting element, 12 second light-emitting element, 20 substrate material, 21 first electrode, 22 second electrode, 23 third electrode, 31 first mounting region, 32 second mounting region, 33 groove, 41 first anisotropic conductive film, 42 second anisotropic conductive film, 51 first anisotropic conductive paste, 52 second anisotropic conductive paste, 111 first conductive cladding layer, 112 active layer, 113 second conductive cladding layer, 114 passivation layer, 211 first light-emitting element, 212 second light-emitting element, 220 substrate material, 221 first electrode, 222 second electrode, 223 third electrode, 231 first mounting region, 232 second mounting region, 241 first anisotropic conductive film, 242 second anisotropic conductive film

The invention claimed is:

1. A light-emitting device comprising:
    a first light-emitting element and a second light-emitting element each having a pair of electrodes on one surface;
    a substrate having a first mounting region on which the first light-emitting element is mounted, a second mounting region on which the second light-emitting element is mounted, a first electrode having a groove formed between the first mounting region and the second mounting region and connected to one electrode of the first light-emitting element and one electrode of the second light-emitting element, a second electrode formed in the first mounting region and connected to the other electrode of the first light-emitting element, and a third electrode formed in the second mounting region and connected to the other electrode of the second light-emitting element;
    a first anisotropic conductive film connecting the first light-emitting element to the first electrode and the second electrode; and
    a second anisotropic conductive film connecting the second light-emitting element to the first electrode and the third electrode.

2. The light-emitting device according to claim 1, wherein the first anisotropic conductive film contains light-reflective electrically insulating particles and is filled in at least a portion of the groove formed in the first electrode.

3. The light-emitting device according to claim 2, wherein the first mounting region and the second mounting region are rectangular regions, and
    wherein the groove formed in the first electrode is longer than a side of the first mounting region adjacent to the second mounting region.

4. The light-emitting device according to claim 2, wherein the first light-emitting element and the second light-emitting element have different heights.

5. The light-emitting device according to claim 1, wherein the first mounting region and the second mounting region are rectangular regions, and
    wherein the groove formed in the first electrode is longer than a side of the first mounting region adjacent to the second mounting region.

6. The light-emitting device according to claim 5, wherein the first light-emitting element and the second light-emitting element have different heights.

7. The light-emitting device according to claim 1, wherein the first light-emitting element and the second light-emitting element have different heights.

8. A method for manufacturing a light-emitting device comprising:
    a preparing step of preparing a first light-emitting element and a second light-emitting element each having a pair of electrodes on one surface, and a substrate having a first mounting region on which the first light-emitting element is to be mounted, a second mounting region on which the second light-emitting element is to be mounted, a first electrode having a groove formed between the first mounting region and the second mounting region, the first electrode to be connected to one electrode of the first light-emitting element and to one electrode of the second light-emitting element, a second electrode formed in the first mounting region, the second electrode to be connected to the other electrode of the first light-emitting element, and a third electrode formed in the second mounting region, the third electrode to be connected to the other electrode of the second light-emitting element;
    a first mounting step of mounting the first light-emitting element onto the first mounting region using a first anisotropic conductive paste; and
    a second mounting step of mounting the second light-emitting element onto the second mounting region using a second anisotropic conductive paste.

9. The method for manufacturing a light-emitting device according to claim 8, wherein the first anisotropic conductive film contains light-reflective electrically insulating particles, and
    wherein the first mounting step includes filling the first anisotropic conductive paste into at least a portion of the groove formed in the first electrode.

10. The method for manufacturing a light-emitting device according to claim 9, wherein the first mounting region and the second mounting region are rectangular regions, and
    wherein the groove formed in the first electrode is longer than a side of the first mounting region adjacent to the second mounting region.

11. The method for manufacturing a light-emitting device according to claim 9, wherein the first light-emitting element and the second light-emitting element have different heights.

12. The method for manufacturing a light-emitting device according to claim 8, wherein the first mounting region and the second mounting region are rectangular regions, and
    wherein the groove formed in the first electrode is longer than a side of the first mounting region adjacent to the second mounting region.

13. The method for manufacturing a light-emitting device according to claim 12, wherein the first light-emitting element and the second light-emitting element have different heights.

14. The method for manufacturing a light-emitting device according to claim 8, wherein the first light-emitting element and the second light-emitting element have different heights.

\* \* \* \* \*